(12) United States Patent
Cao et al.

(10) Patent No.: US 11,156,701 B2
(45) Date of Patent: Oct. 26, 2021

(54) LIDAR WITH HIGH TIME RESOLUTION

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/128,924

(22) Filed: Dec. 21, 2020

(65) Prior Publication Data

US 2021/0109201 A1    Apr. 15, 2021

Related U.S. Application Data

(63) Continuation of application No. PCT/CN2018/095527, filed on Jul. 12, 2018.

(51) Int. Cl.
| | |
|---|---|
| *G01C 3/08* | (2006.01) |
| *G01S 7/4865* | (2020.01) |
| *G01S 7/4863* | (2020.01) |
| *H01L 31/107* | (2006.01) |

(52) U.S. Cl.
CPC .......... *G01S 7/4865* (2013.01); *G01S 7/4863* (2013.01); *H01L 31/107* (2013.01)

(58) Field of Classification Search
CPC ..... G01S 7/4865; G01S 7/4863; H01L 31/107
USPC .......................................................... 356/5.01
See application file for complete search history.

(56) References Cited

U.S. PATENT DOCUMENTS

| | | | |
|---|---|---|---|
| 9,784,835 B1 | 10/2017 | Droz et al. | |
| 2006/0027730 A1* | 2/2006 | Bamji | .................... H04N 5/355 250/208.1 |
| 2014/0319638 A1* | 10/2014 | Chia | ................... H01L 31/1075 257/438 |
| 2015/0025852 A1 | 1/2015 | Fukuchi et al. | |
| 2015/0061735 A1 | 3/2015 | Lee et al. | |
| 2018/0069145 A1* | 3/2018 | Ishida | ............... H01L 27/14632 |

FOREIGN PATENT DOCUMENTS

| | | | | |
|---|---|---|---|---|
| CN | 107533146 A | 1/2018 | | |
| CN | 108271415 A | 7/2018 | | |
| EP | 3147690 A1 | 3/2017 | | |
| JP | 02006270616 A | * 10/2006 | ............. | H04B 10/04 |
| WO | 2007015756 A2 | 2/2007 | | |

* cited by examiner

*Primary Examiner* — Mark Hellner
(74) *Attorney, Agent, or Firm* — IPro, PLLC; Qian Gu

(57) ABSTRACT

Disclosed herein is a method and apparatus for determining time of arrival of incident photons. The time of arrival may be determined with high time accuracy based on characteristics of the rate of change of a voltage across a capacitor being charged by charge carriers generated from the incident photons.

19 Claims, 14 Drawing Sheets

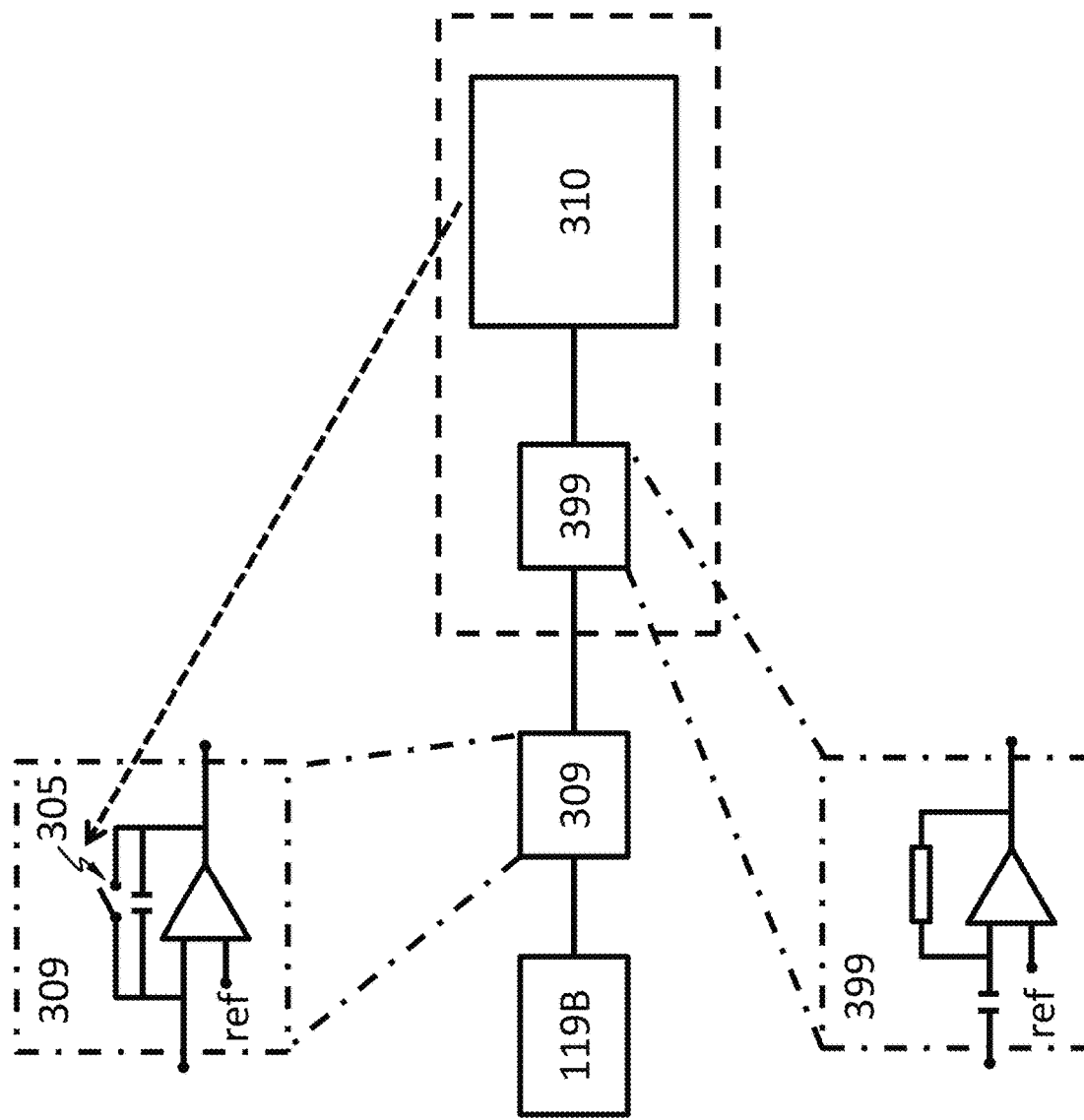

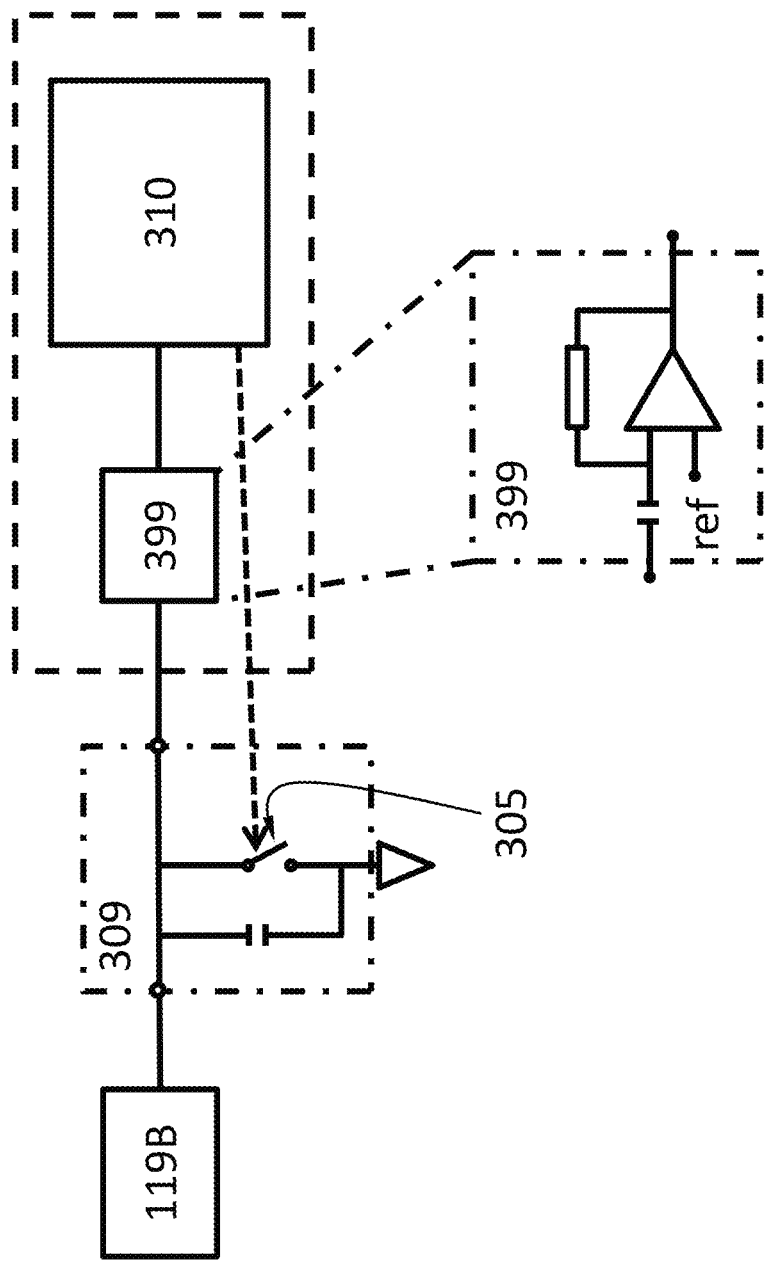

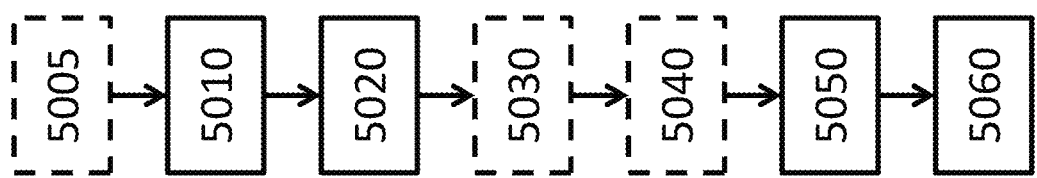

LIDAR WITH HIGH TIME RESOLUTION

TECHNICAL FIELD

The disclosure herein relates to LIDAR, particularly relates to a LIDAR detector with high time resolution.

BACKGROUND

Light Detection and Ranging (LIDAR) is a method of object detection, range finding and mapping. LIDAR uses a technology analogous to radar. There are several major components to a LIDAR system: a light source (e.g., laser), optics, a photon detector and electronics for signal processing. For example, by controlled steering of scanning laser beams, and processing the light reflected from distant objects (e.g., buildings and landscapes), distances and shapes of these objects may be obtained.

One application of LIDAR is in autonomous vehicles (e.g., driverless cars). A LIDAR system in an autonomous vehicle ("on-vehicle LIDAR") may be used for obstacle detection and collision avoidance, which helps the vehicle to navigate safely through environments. An on-vehicle LIDAR may be mounted on the roof of an autonomous vehicle and light beams from the LIDAR system rotate constantly to monitor the environment around the vehicle. The LIDAR system provides the necessary data for determining where potential obstacles exist in the environment, for identifying the spatial structure of obstacles, for distinguishing obstacles, and for estimating the impact of driving over obstacles. One advantage of the LIDAR system compared to radar is that the LIDAR system can provide more accurate ranging and cover a larger field of view.

SUMMARY

Disclosed herein is a method comprising: receiving photons using a photon detector comprising a capacitor; charging the capacitor with charge carriers generated by the photons; obtaining rates of change of a voltage across the capacitor; and determining a time at which the photons arrive at the photon detector, based on characteristics of the rates of change.

According to an embodiment, the method further comprises resetting the voltage across the capacitor.

According to an embodiment, the characteristics of the rates of change comprise a time at which the rates of change have an extremum.

According to an embodiment, the characteristics of the rates of change comprise a time at which the rates of change have a discontinuity.

According to an embodiment, the method further comprises emitting a light pulse.

According to an embodiment, the method further comprises allowing the capacitor to be charged upon emitting the light pulse.

According to an embodiment, the photons received by the photon detector are of the light pulse scattered by an object.

According to an embodiment, the method further comprises determining a distance of the object to the photon detector based on the time at which the photons arrive at the photon detector.

Disclosed herein is a photon detector, comprising: a photon absorption layer comprising an electric contact, the photon absorption layer configured to receive photons and to generate charge carriers from the photons; a capacitor electrically connected to the electric contact and configured to be charged by the charge carriers; and a controller; wherein the controller is configured to obtain rates of change of a voltage across the capacitor and configured to determine a time at which the photons arrive at the photon detector, based on characteristics of the rates of change.

According to an embodiment, the controller is configured to reset the voltage across the capacitor.

According to an embodiment, the characteristics of the rates of change comprise a time at which the rates of change have an extremum.

According to an embodiment, the characteristics of the rates of change comprise a time at which the rates of change have a discontinuity.

According to an embodiment, the photon absorption layer comprises a diode.

According to an embodiment, the photon absorption layer comprises a resistor.

According to an embodiment, the photon absorption layer comprises an amplification region comprising a junction with an electric field in the junction; wherein the electric field is at a sufficient strength to cause an avalanche of charge carriers in the amplification region.

According to an embodiment, the photon absorption layer comprises silicon, germanium, GaAs, CdTe, CdZnTe, or a combination thereof.

According to an embodiment, the photon detector further comprises an array of pixels.

According to an embodiment, the photons are scattered by an object toward the photon detector, wherein the controller is configured to determine a distance of the object to the photon detector based on the time at which the photons arrive at the photon detector.

Disclosed herein is a LIDAR system comprising the photon detector disclosed herein and a light source configured to emit a light pulse.

BRIEF DESCRIPTION OF FIGURES

FIG. 3A and FIG. 3B each show a component diagram of an electronic system of the photon detector in FIG. 2B of FIG. 2C, according to an embodiment.

FIG. 5 shows a flow chart for a method for determining a time at which a light pulse arrives at the photon detector, according to an embodiment.

DETAILED DESCRIPTION

Figure 1:
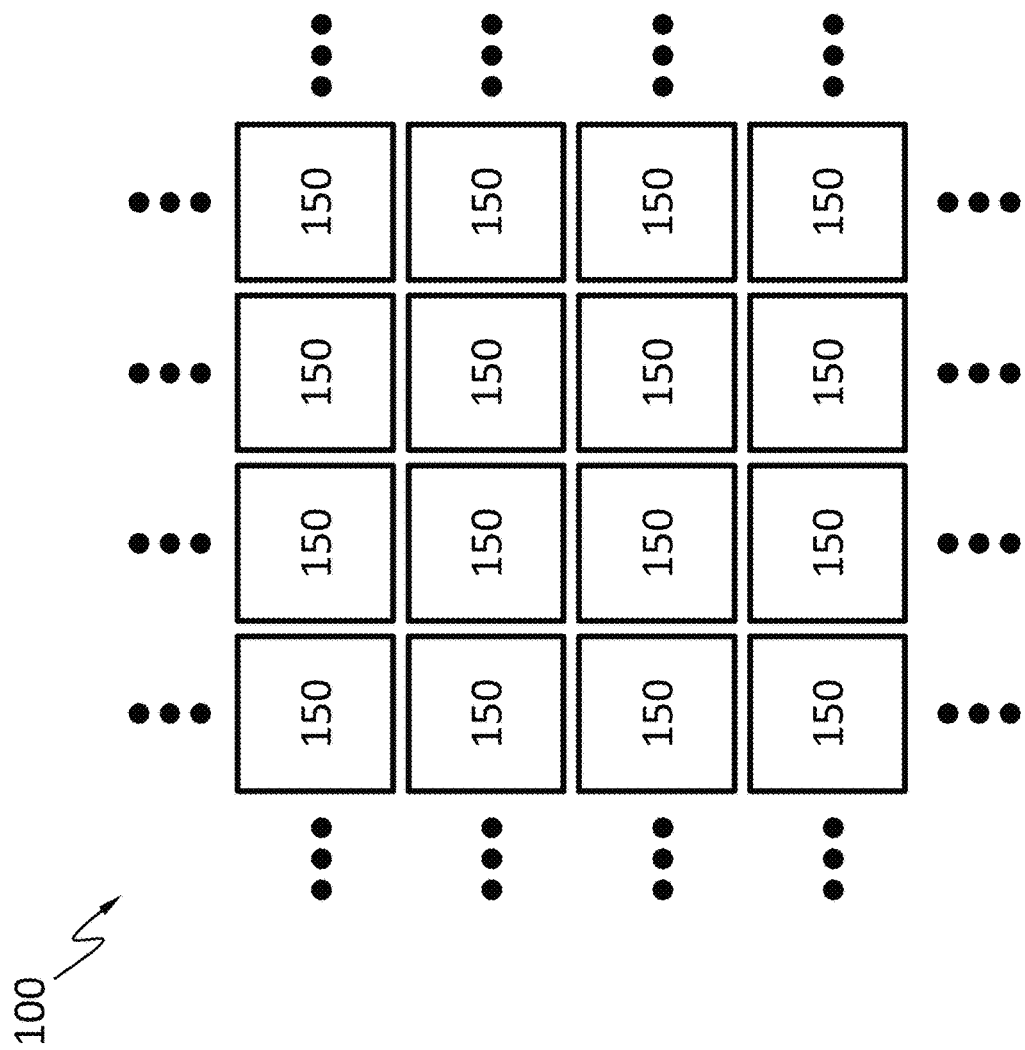
FIG. 1 schematically shows a photon detector, according to an embodiment.

FIG. 1 schematically shows a photon detector 100, as an example, which may be part of a LIDAR system. The photon detector 100 has an array of pixels 150. The array may be a rectangular array, a honeycomb array, a hexagonal array or any other suitable array. Each pixel 150 is configured to detect photons (e.g., photons reflected back from a scene and incident thereon), and may be configured to measure a characteristic (e.g., the energy, the wavelength, and the frequency) of the photons. For example, each pixel 150 is configured to count numbers of photons incident thereon whose energy falls in a plurality of bins, within a period of time. All the pixels 150 may be configured to count the numbers of photons incident thereon within a plurality of bins of energy within the same period of time. In one embodiment, where the incident photons may belong to a reflected light pulse and have the same energy, the pixels 150 may be configured to count the numbers of photons incident thereon within a period of time, without measuring the energy of the individual photons. Each pixel 150 may have its own analog-to-digital converter (ADC) configured to digitize an analog signal representing the energy of an incident photon into a digital signal, or to digitize an analog signal representing the total energy of a plurality of incident photons into a digital signal. The pixels 150 may be configured to operate in parallel. The pixels 150 are not necessarily synchronized. For example, when one pixel 150 measures an incident photon, another pixel 150 may be waiting for a photon to arrive. The pixels 150 may be individually addressable.

Figure 2A:
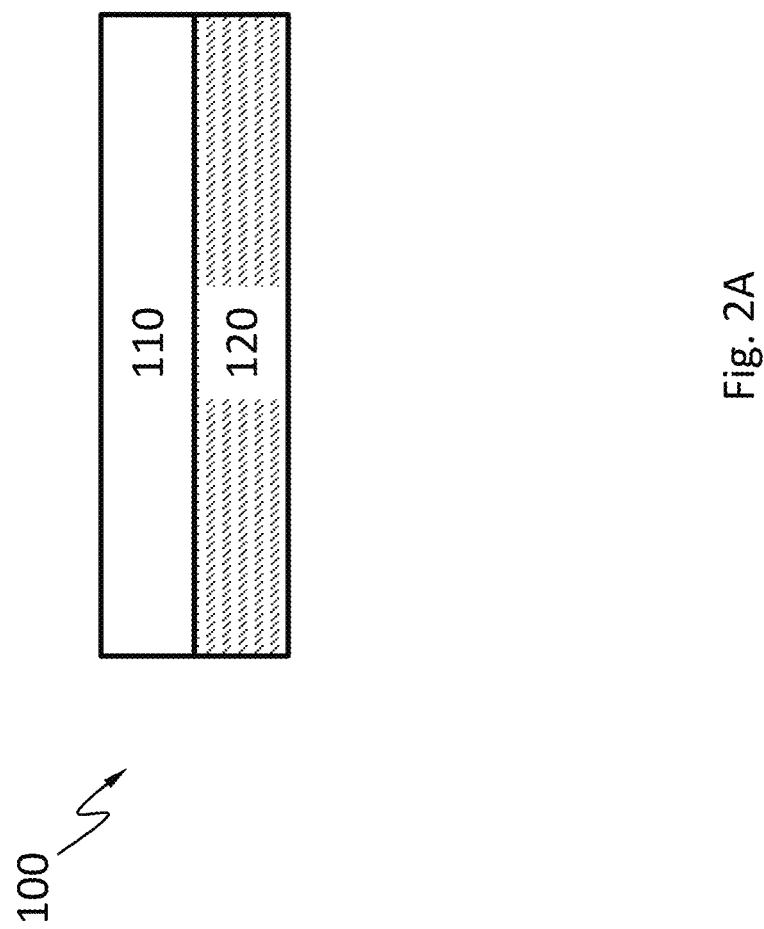
FIG. 2A schematically shows a cross-sectional view of the photon detector, according to an embodiment.

FIG. 2A schematically shows a cross-sectional view of the photon detector 100, according to an embodiment. The photon detector 100 may include a photon absorption layer 110 and an electronics layer 120 (e.g., an ASIC) for processing or analyzing electrical signals incident photon generates in the photon absorption layer 110. The photon detector 100 may or may not include a scintillator. The photon absorption layer 110 may include a semiconductor material such as, silicon, germanium, GaAs, CdTe, CdZnTe, or a combination thereof. The semiconductor may have a high mass attenuation coefficient for the photon of interest.

Figure 2B:
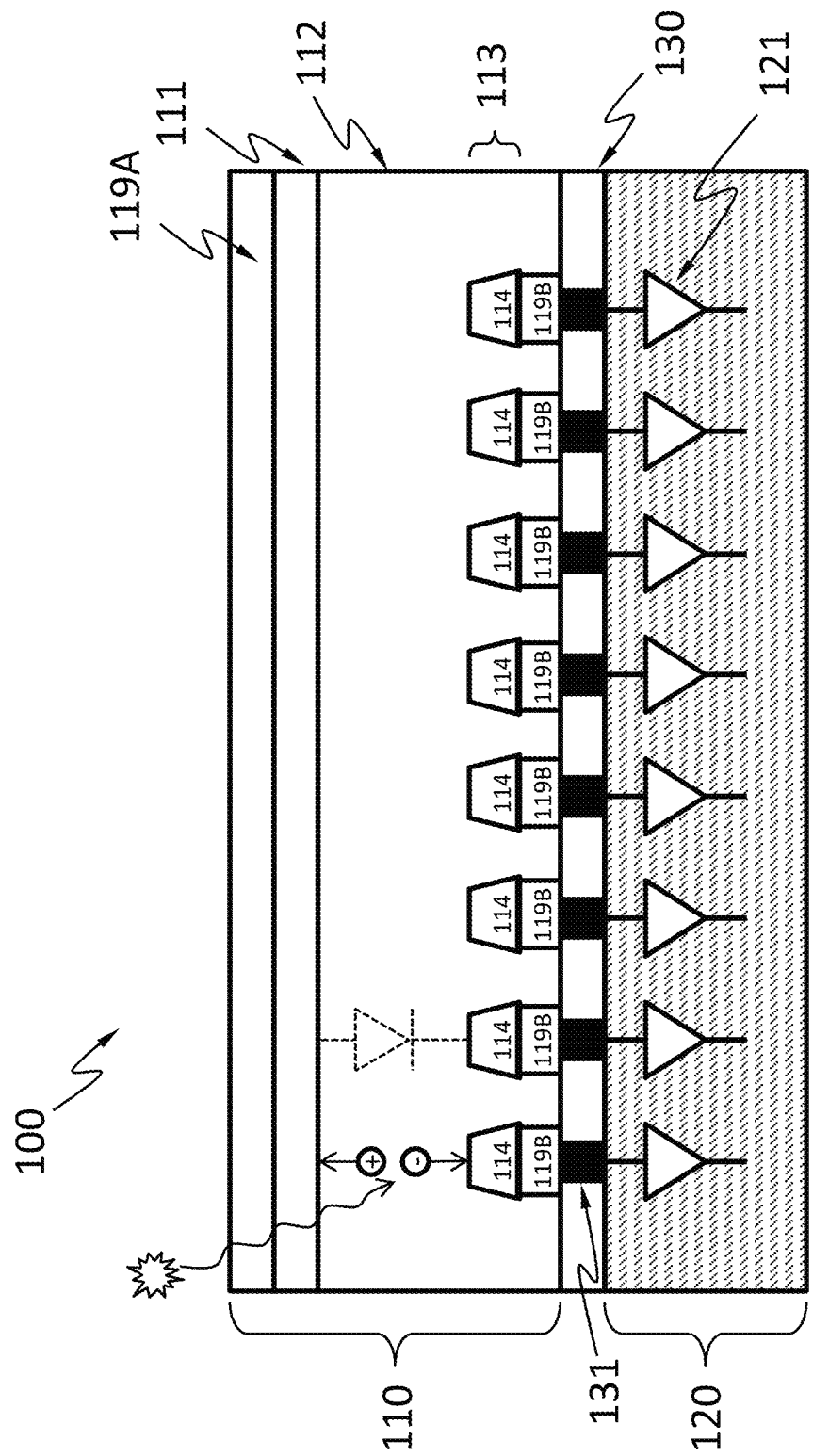
FIG. 2B schematically shows a detailed cross-sectional view of the photon detector, according to an embodiment.

As shown in a detailed cross-sectional view of the photon detector 100 in FIG. 2B, according to an embodiment, the photon absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 2B, each of the discrete regions 114 of the second doped region 113 forms a diode with the first doped region 111 and the optional intrinsic region 112. Namely, in the example in FIG. 2B, the photon absorption layer 110 has a plurality of diodes having the first doped region 111 as a shared electrode. The first doped region 111 may also have discrete portions.

When photons (e.g., photons of a reflected light pulse into the photon detector 100) hit the photon absorption layer 110 including diodes, the photons may be absorbed and generate one or more charge carriers by a number of mechanisms. The charge carriers may drift to the electrodes of one of the diodes under an electric field. The field may be an external electric field. The electric contact 119B may include discrete portions each of which is in electrical contact with the discrete regions 114. In an embodiment, the charge carriers may drift in directions such that the charge carriers generated by a single photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a photon incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a photon incident therein flow to the discrete region 114. Namely, less than 2%, less than 1%, less than 0.1%, or less than 0.01% of these charge carriers flow beyond the pixel.

Figure 2C:
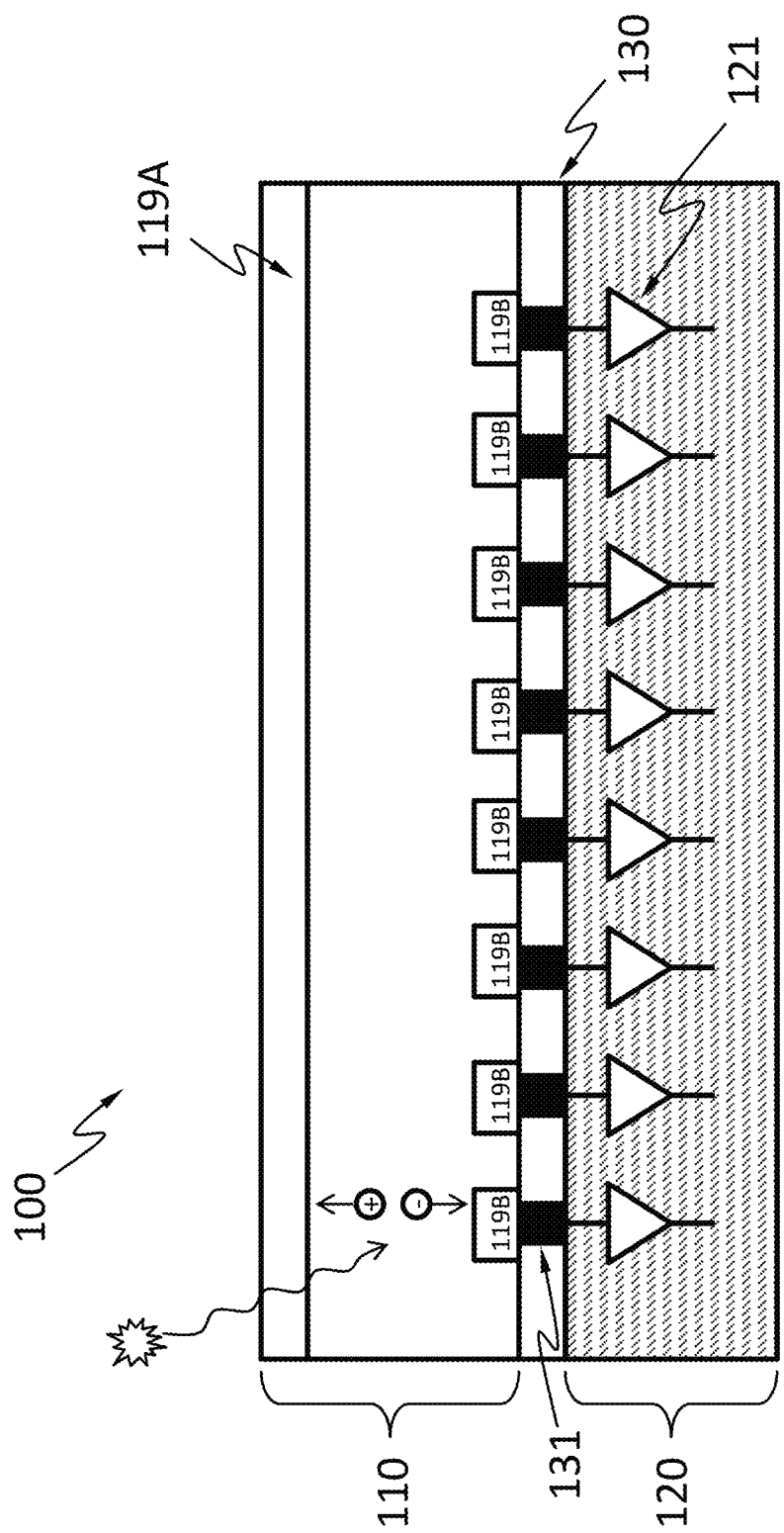
FIG. 2C schematically shows an alternative detailed cross-sectional view of the photon detector, according to an embodiment.

As shown in an alternative detailed cross-sectional view of the photon detector 100 in FIG. 2C, according to an embodiment, the photon absorption layer 110 may include a resistor of a semiconductor material such as, silicon, germanium, GaAs, CdTe, CdZnTe, or a combination thereof, but does not include a diode. The semiconductor may have a high mass attenuation coefficient for the photon of interest.

When photons (e.g., of a reflected light pulse into the photon detector 100) hit the photon absorption layer 110 including a resistor but not diodes, they may be absorbed and generate one or more charge carriers by a number of mechanisms. A photon may generate one or more charge carriers. The charge carriers may drift to the electric contacts 119A and 119B under an electric field. The field may be an external electric field. The electric contact 119B includes discrete portions. In an embodiment, the charge carriers may drift in directions such that the charge carriers generated by a photon are not substantially shared by two different discrete portions of the electric contact 119B ("not substantially shared" here means less than 2%, less than 0.5%, less than 0.1%, or less than 0.01% of these charge carriers flow to a different one of the discrete portions than the rest of the charge carriers). Charge carriers generated by a photon incident around the footprint of one of these discrete portions of the electric contact 119B are not substantially shared with another of these discrete portions of the electric contact 119B. A pixel 150 associated with a discrete portion of the electric contact 119B may be an area around the discrete portion in which substantially all (more than 98%, more than 99.5%, more than 99.9% or more than 99.99% of) charge carriers generated by a photon incident therein flow to the discrete portion of the electric contact 119B. Namely, less than 2%, less than 0.5%, less than 0.1%, or less than 0.01% of these charge carriers flow beyond the pixel associated with the one discrete portion of the electric contact 119B.

The electronics layer 120 may include an electronic system 121 suitable for processing or interpreting signals generated by the photons incident on the photon absorption layer 110. The electronic system 121 may include an analog circuitry such as a filter network, amplifiers, integrators, and comparators, or a digital circuitry such as a microprocessor, and memory. The electronic system 121 may include one or more ADCs. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the photon absorption layer 110. Other bonding techniques are possible to connect the electronic system 121 to the pixels without using vias.

FIG. 3A and FIG. 3B each show a component diagram of the electronic system 121, according to an embodiment. The electronic system 121 may include a differentiator 399, and a controller 310.

The differentiator 399 is configured to output the rate of change (i.e., derivative with respect to time) of the voltage of the electric contact 119B or the rate of change of a function of the voltage. In an example shown in FIG. 3A and FIG. 3B, the differentiator 399 comprises an op-amp, a capacitor connected to the inverting input of the op-amp and a resistor connected to the non-inverting input and the output of the op-amp, where the differentiator 399 receives the voltage of the electric contact 119B or a function of the voltage (e.g., the voltage amplified by the capacitor module 309 below).

The electronic system 121 may include a capacitor module 309 electrically connected to the electric contact 119B, wherein the capacitor module is configured to collect charge carriers from the electric contact 119B. The capacitor module 309 can include a capacitor. In one embodiment, the capacitor may be in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electric contact 119B accumulate on the capacitor over a period of time, after which, the capacitor voltage (i.e., the voltage across the two terminals of the capacitor) is sampled and then reset by a reset switch. The capacitor module can include a capacitor directly connected to the electric contact 119B.

The controller 310 may be a hardware component such as a microcontroller and a microprocessor. In one embodiment, in response to a light pulse being emitted by a light source, the controller 310 may be configured to control the capacitor of the capacitor module 309 to start accumulating on the capacitor charge carriers generated from photons of a light pulse received by the photon absorption layer 110 (i.e., charging the capacitor with charge carriers generated from the photons in the photon absorption layer 110). For example, the controller 310 may control the capacitor to disconnect from a ground at the time that a light pulse is emitted from a light source, or alternatively, at some time (e.g., a configurable time determined or specified after calibration) after the emission of such a light pulse. In an embodiment, the controller 310 may also be configured to control the light source.

The controller 310 may be configured to measure characteristics of the waveform of the rate of change (i.e., the rate of change as a function of time). In an example, the controller 310 may be configured to record a time (e.g., τ0) at which the rate of change shows an upward discontinuity, or a time (e.g., τ1) at which the rate of change shows a downward discontinuity. In an example, the controller 310 may be configured to record a time (e.g., τ1) at which the rate of change reaches a maximum, or a time at which the rate of change reaches a minimum. In an example, the controller 310 may be configured to record a time (e.g., τ5) at which the rate of change reaches a threshold (e.g., U1).

The controller 310 may be configured to reset the voltage (e.g., by connecting the electric contact 119B to an electrical ground). The controller 310 may connect the electric contact 119B to the electrical ground by controlling the switch 305. The switch may be a transistor such as a field-effect transistor (FET).

In an embodiment, the electronic system 121 has no analog filter network (e.g., a RC network). In an embodiment, the electronic system 121 has no analog circuitry.

Figure 4A:
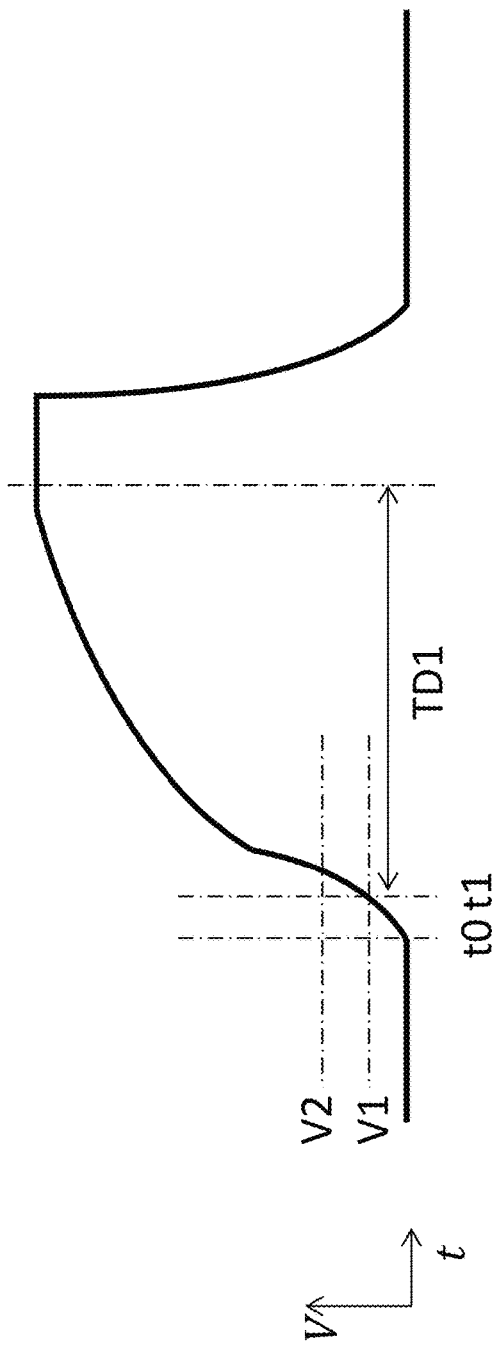
FIG. 4A schematically shows a temporal change of the voltage of the electric contact 119B of FIG. 2A or FIG. 2C or the voltage across the capacitor of the capacitor module 309 of FIG. 3A or FIG. 3B connected to the electric contact 119B, caused by charge carriers generated by photons (e.g., of a reflected light pulse) incident on the diode or the resistor, according to an embodiment.

FIG. 4A schematically shows a temporal change of the voltage of the electric contact 119B or the voltage across the capacitor of the capacitor module 309 connected to the electric contact 119B, caused by charge carriers generated by photons (e.g., of a reflected light pulse) incident on the diode or the resistor, according to an embodiment. At a time t0, charge carriers may start charging the capacitor, and the absolute value of the voltage across the capacitor may start to increase. In one embodiment, the time t0 may be the time at which photons of a reflected light pulse incident on the diode or the resister. In one embodiment, the time t0 may be the time at which the light pulse is emitted by a light source. In one embodiment, the time t0 may be a time after a delay from the time at which the light pulse is emitted by a light source.

Figure 4B:
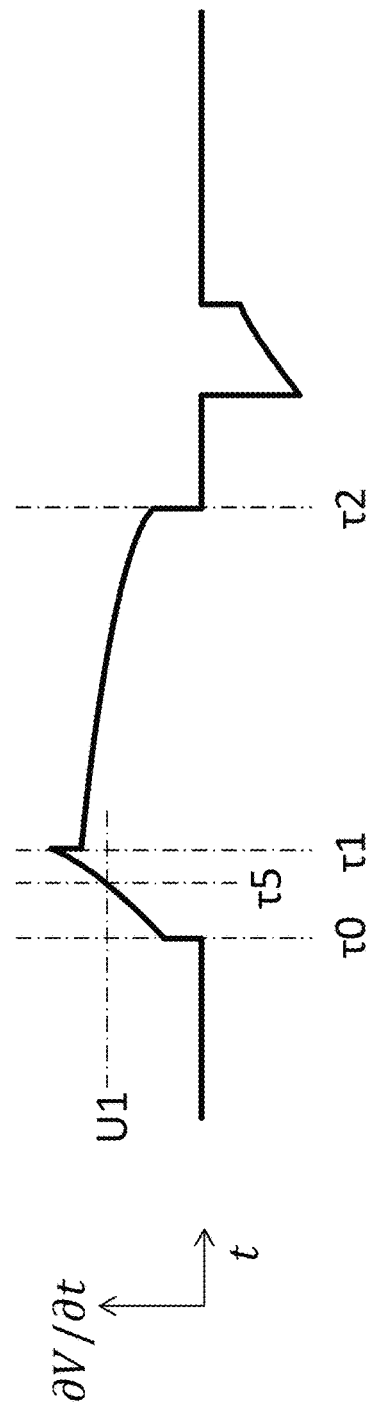
FIG. 4B schematically shows the rate of change of the voltage in FIG. 4A.

FIG. 4B schematically shows the rate of change of the voltage in FIG. 4A. Characteristics of the rate of change may be used to determine a time at which photons of a reflected light pulse arrive at the photon detector 100. For example, characteristics may include magnitude or time of certain features (e.g., extrema and discontinuities) in the rate of change.

FIG. 5 shows a flow chart for a method for determining a time at which photons of a reflected light pulse arrive at the photon detector 100, according to an embodiment. In procedure 5010, the photons are received by the photon detector 100 and charge carriers are generated from the photons. For example, the photons may be absorbed by the photon absorption layer 110 and charge carriers may be generated from the photons in the photon absorption layer 110. In procedure 5020, a capacitor (e.g., the capacitor in the capacitor module 309) is charged by the charge carriers. In optional procedure 5030, a first time (e.g., t1) at which an absolute value of a voltage across the capacitor equals or exceeds an absolute value of a first threshold (e.g., V1) is obtained. In optional procedure 5040, characteristics of the rate of change of the voltage are obtained. In procedure 5050, upon determining that the absolute value of the voltage across the capacitor equals or exceeds an absolute value of a second threshold (e.g., V2) before expiration of a time delay (e.g., TD1) from the first time, characteristics of the rate of change of the voltage are obtained. In procedure 5060, a time at which the photons arrive at the photon detector 100 is determined, based on the characteristics of the rate of change obtained in procedure 5050, and optionally on the characteristics of the rate of change obtained before procedure 5050. In an embodiment, upon determining that the absolute value of the voltage across the capacitor is less than the absolute value of the second threshold after expiration of the time delay, the voltage across the capacitor may be reset. The method may further include, in optional procedure 5005, emitting a light pulse. The capacitor may be allowed to be charged upon emitting the light pulse, or only after some time from the emission of the light pulse. The photons received by the photon detector 100 may be among the photons of the light pulse reflected by an object. The time at which the photons arrive at the photon detector 100 may be used to determine a distance of the object to the photon detector 100.

According to an embodiment, the photon detector 100 may use delta-sigma (sigma-delta, ΔΣ or ΣΔ) modulation. The first step in a delta-sigma modulation is delta modulation. In delta modulation the change in the signal (its delta) is encoded, rather than the absolute value. The result is a stream of pulses, as opposed to a stream of numbers. The digital output (i.e., the pulses) is passed through a 1-bit DAC and the resulting analog signal (sigma) is added to the input signal of the ADC. During the integration of the analog signal, when the analog signal reaches the delta, a counter is increased by one and the delta is deducted from the analog signal. At the end of the integration, the registered value of the counter is the digital signal and the remaining analog signal smaller than the delta is the residue analog signal.

Figure 6:
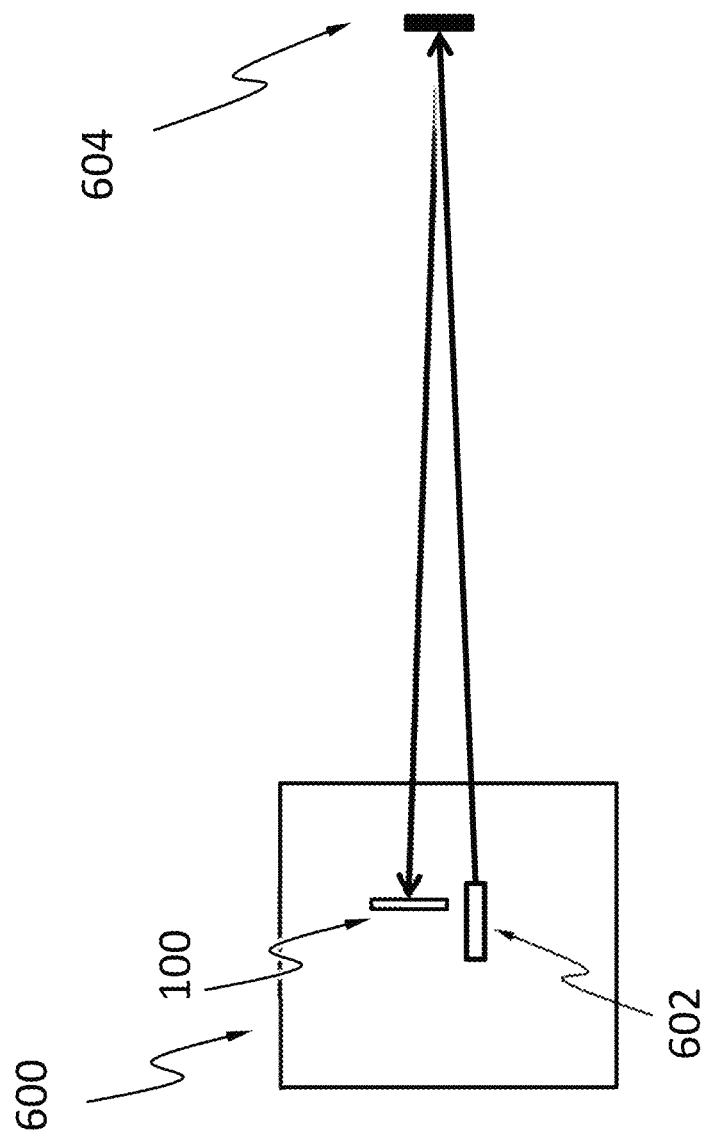
FIG. 6 schematically shows a system comprising the photon detector described herein.

FIG. 6 schematically shows a LIDAR system 600 comprising the photon detector 100 described herein, according to an embodiment. The LIDAR system 600 may be mounted on a vehicle (e.g., automobile or drone) and used as an on-vehicle LIDAR. The LIDAR system 600 may comprise a light source 602 configured to emit a light pulse. The light source 602 may be a laser source. The light source 602 may be configured to generate scanning light pulses and the photon detector 100 may be used detect reflection of the light pulses by an object (e.g., a building, a person, an obstacle, or landscape) in a scene 604. In one embodiment, a characteristic (e.g., the distance, shape, or motion) of the object may be obtained based on the times at which photons reflected by the object arrive at the photon detector 100. In one embodiment, the LIDAR system 600 may have one or more filters upstream to the photon detector 100 to diminish the impact of ambient light. The LIDAR system 600 may be configured to perform the method in FIG. 5 or otherwise described herein.

In some embodiments, the photon absorption layer 110 may include avalanche photodiodes (APDs). The electronic system 121 described above and the methods for determining a time at which photons arrive at the photon detector may still apply to a photon detector with APDs.

An avalanche photodiode (APD) is a photodiode that uses the avalanche effect to generate an electric current upon exposure to light. The avalanche effect is a process where free charge carriers in a material are subjected to strong acceleration by an electric field and subsequently collide with other atoms of the material, thereby ionizing them (impact ionization) and releasing additional charge carriers which accelerate and collide with further atoms, releasing more charge carriers—a chain reaction. Impact ionization is a process in a material by which one energetic charge carrier can lose energy by the creation of other charge carriers. For example, in semiconductors, an electron (or hole) with enough kinetic energy can knock a bound electron out of its bound state (in the valence band) and promote it to a state in the conduction band, creating an electron-hole pair. An example of the photon detector 100 comprising APDs may be the photon detector 800 as described herein.

An APD may work in the Geiger mode or the linear mode. When the APD works in the Geiger mode, it may be called a single-photon avalanche diode (SPAD) (also known as a Geiger-mode APD or G-APD). A SPAD is an APD working under a reverse bias above the breakdown voltage. Here the word "above" means that absolute value of the reverse bias is greater than the absolute value of the breakdown voltage. A SPAD may be used to detect low intensity light (e.g., down to a single photon) and to signal the arrival times of the photons with a jitter of a few tens of picoseconds. A SPAD may be in a form of a p-n junction under a reverse bias (i.e., the p-type region of the p-n junction is biased at a lower electric potential than the n-type region) above the breakdown voltage of the p-n junction. The breakdown voltage of a p-n junction is a reverse bias, above which exponential increase in the electric current in the p-n junction occurs. An APD working at a reverse bias below the breakdown voltage is operating in the linear mode because the electric current in the APD is proportional to the intensity of the light incident on the APD.

Figure 7C:
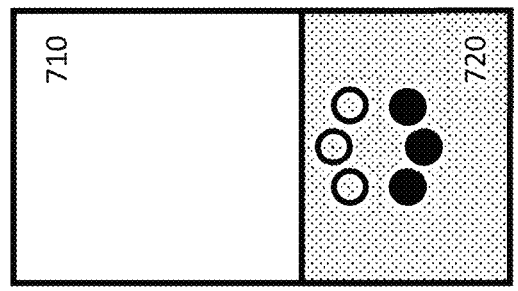
FIG. 7A, FIG. 7B and FIG. 7C schematically show the operation of an APD, according to an embodiment.
Figure 7B:
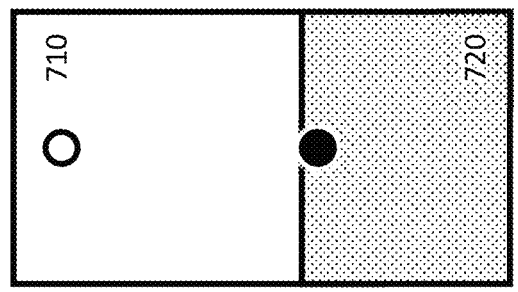
Figure 7A:
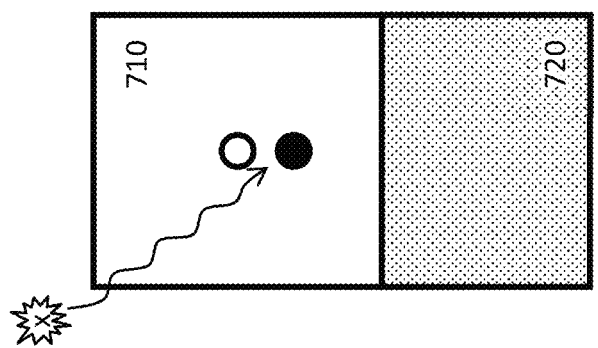

FIG. 7A, FIG. 7B and FIG. 7C schematically show the operation of an APD, according to an embodiment. FIG. 7A shows that when a photon is absorbed by an absorption region 710, multiple electron-hole pairs may be generated. The absorption region 710 has a sufficient thickness and thus a sufficient absorptance (e.g., >80% or >90%) for the incident photon. In an example, the absorption region 710 may be a silicon layer with a thickness of 10 microns or above. The electric field in the absorption region 710 is not high enough to cause avalanche effect in the absorption region 710. FIG. 7B shows that the electrons and hole drift in opposite directions in the absorption region 710. FIG. 7C shows that avalanche effect occurs in an amplification region 720 when the electrons (or the holes) enter that amplification region 720, thereby generating more electrons and holes. The electric field in the amplification region 720 is high enough to cause an avalanche of charge carriers entering the amplification region 720 but not too high to make the avalanche effect self-sustaining. A self-sustaining avalanche is an avalanche that persists after the external triggers disappear, such as photons incident on the APD or charge carriers drifted into the APD. The electric field in the amplification region 720 may be a result of a doping profile in the amplification region 720. For example, the amplification region 720 may include a p-n junction or a heterojunction that has an electric field in its depletion zone. The threshold electric field for the avalanche effect (i.e., the electric field above which the avalanche effect occurs and below which the avalanche effect does not occur) is a property of the material of the amplification region 720. The amplification region 720 may be on one or two opposite sides of the absorption region 710.

Figure 8A:
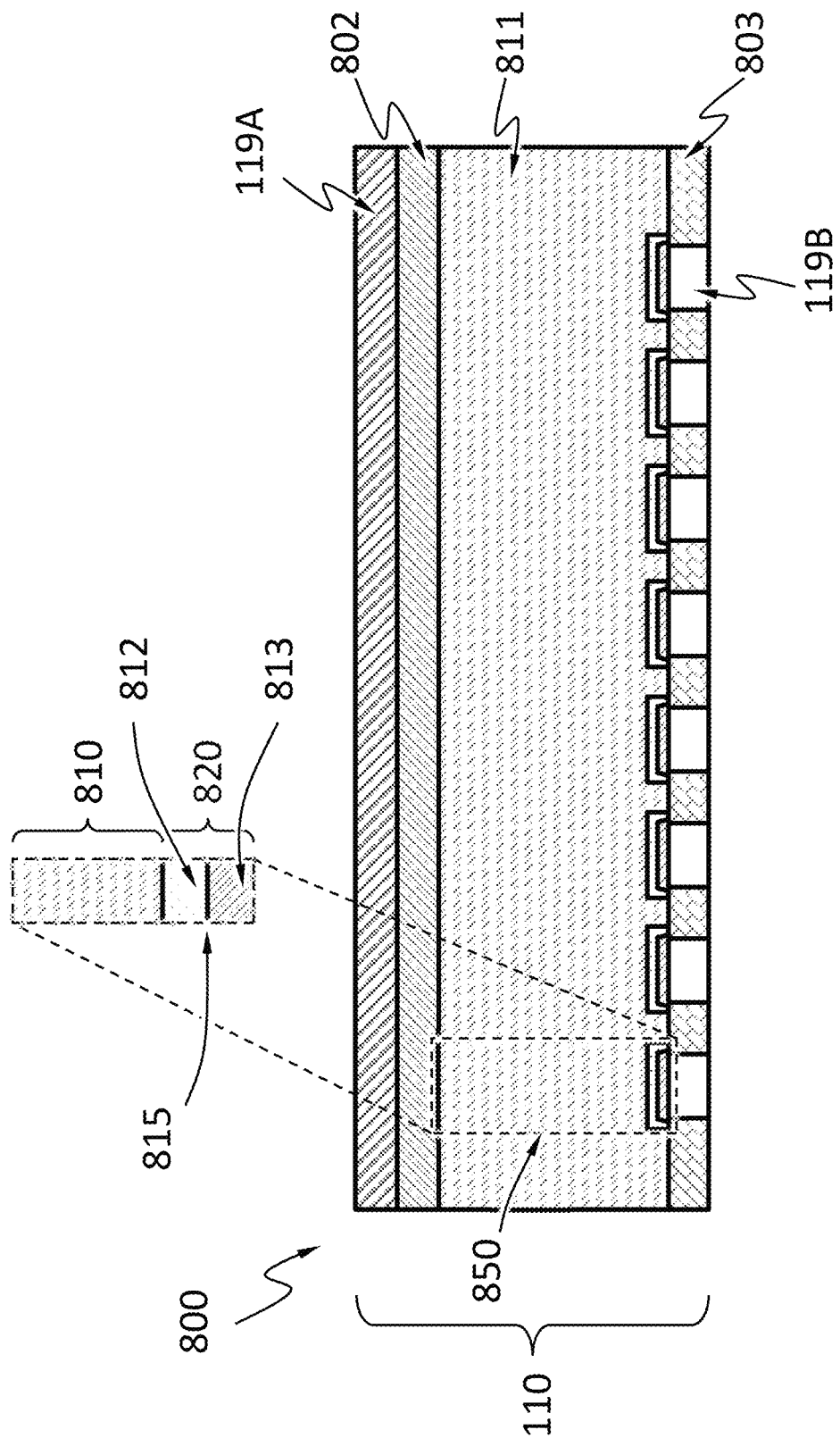
FIG. 8A schematically shows a cross section of a photon detector based on an array of APDs.

FIG. 8A schematically shows a cross section of a photon detector 800 based on an array of APDs 850. Each of the APDs 850 may have an absorption region 810 and an amplification region 820 as the examples of 710 and 720 shown in FIG. 7A, FIG. 7B and FIG. 7C. At least some, or all, of the APDs 850 in the photon detector 800 may have their absorption regions 810 joined together. Namely, the photon detector 800 may have joined absorption regions 810 in a form of an absorption layer 811 that is shared among at least some or all of the APDs 850. The amplification regions 820 of the APDs 850 are discrete regions. Namely the amplification regions 820 of the APDs 850 are not joined together. In an embodiment, the absorption layer 811 may be in form of a semiconductor wafer such as a silicon wafer. The absorption regions 810 may be an intrinsic semiconductor or very lightly doped semiconductor (e.g., $<10^{12}$ dopants/cm$^3$, $<10^{11}$ dopants/cm$^3$, $<10^{10}$ dopants/cm$^3$, $<10^9$ dopants/cm$^3$), with a sufficient thickness and thus a sufficient absorptance (e.g., >80% or >90%) for incident photons of interest. The amplification regions 820 may have a junction 815 formed by at least two layers 812 and 813. The junction 815 may be a heterojunction of a p-n junction. In an embodiment, the layer 812 is a p-type semiconductor (e.g., silicon) and the layer 813 is a heavily doped n-type layer (e.g., silicon). The phrase "heavily doped" is not a term of degree. A heavily doped semiconductor has its electrical conductivity comparable to metals and exhibits essentially linear positive thermal coefficient. In a heavily doped semiconductor, the dopant energy levels are merged into an energy band. A heavily doped semiconductor is also called degenerate semiconductor. The layer 812 may have a doping level of $10^{13}$ to $10^{17}$ dopants/cm$^3$. The layer 813 may have a doping level of $10^{18}$ dopants/cm$^3$ or above. The layers 812 and 813 may be formed by epitaxy growth, dopant implantation or dopant diffusion. The band structures and doping levels of the layers 812 and 813 can be selected such that the depletion zone electric field of the junction 815 is greater than the threshold electric field for the avalanche effect for electrons (or for holes) in the materials of the layers 812 and 813, but is not too high to cause self-sustaining avalanche. Namely, the depletion zone electric field of the junction 815 should cause avalanche when there are incident photons in the absorption region 810 but the avalanche should cease without further incident photons in the absorption region 810.

The photon detector 800 may further include electric contacts 119B respectively in electric contact with the layer 813 of the APDs 850. The electric contacts 119B are configured to collect electric current flowing through the APDs 850.

The photon detector 800 may further include a passivation material 803 configured to passivate surfaces of the absorption regions 810 and the layer 813 of the APDs 850 to reduce recombination at these surfaces.

The photon detector 800 may further include a heavily doped layer 802 disposed on the absorption regions 810 opposite to the amplification region 820, and an electric contact 119A on the heavily doped layer 802. The electric contact 119A of at least some or all of the APDs 850 may be joined together. The heavily doped layer 802 of at least some or all of the APDs 850 may be joined together.

When a photon enters the photon detector 800, it may be absorbed by the absorption region 810 of one of the APDs 850, and charge carriers may be generated in the absorption region 810 as a result. One type (electrons or holes) of the charge carriers drift toward the amplification region 820 of that one APD. When the charge carriers enter the amplification region 820, the avalanche effect occurs and causes amplification of the charge carriers. The amplified charge carriers can be collected through the electric contact 119B of that one APD, as an electric current. When that one APD is in the linear mode, the electric current is proportional to the number of incident photons in the absorption region 810 per unit time (i.e., proportional to the light intensity at that one APD). The electric currents at the APDs may be compiled to represent a spatial intensity distribution of light, i.e., an image. The amplified charge carriers may alternatively be collected through the electric contact 119B of that one APD, and the number of photons may be determined from the charge carriers (e.g., by using the temporal characteristics of the electric current).

Figure 8B:
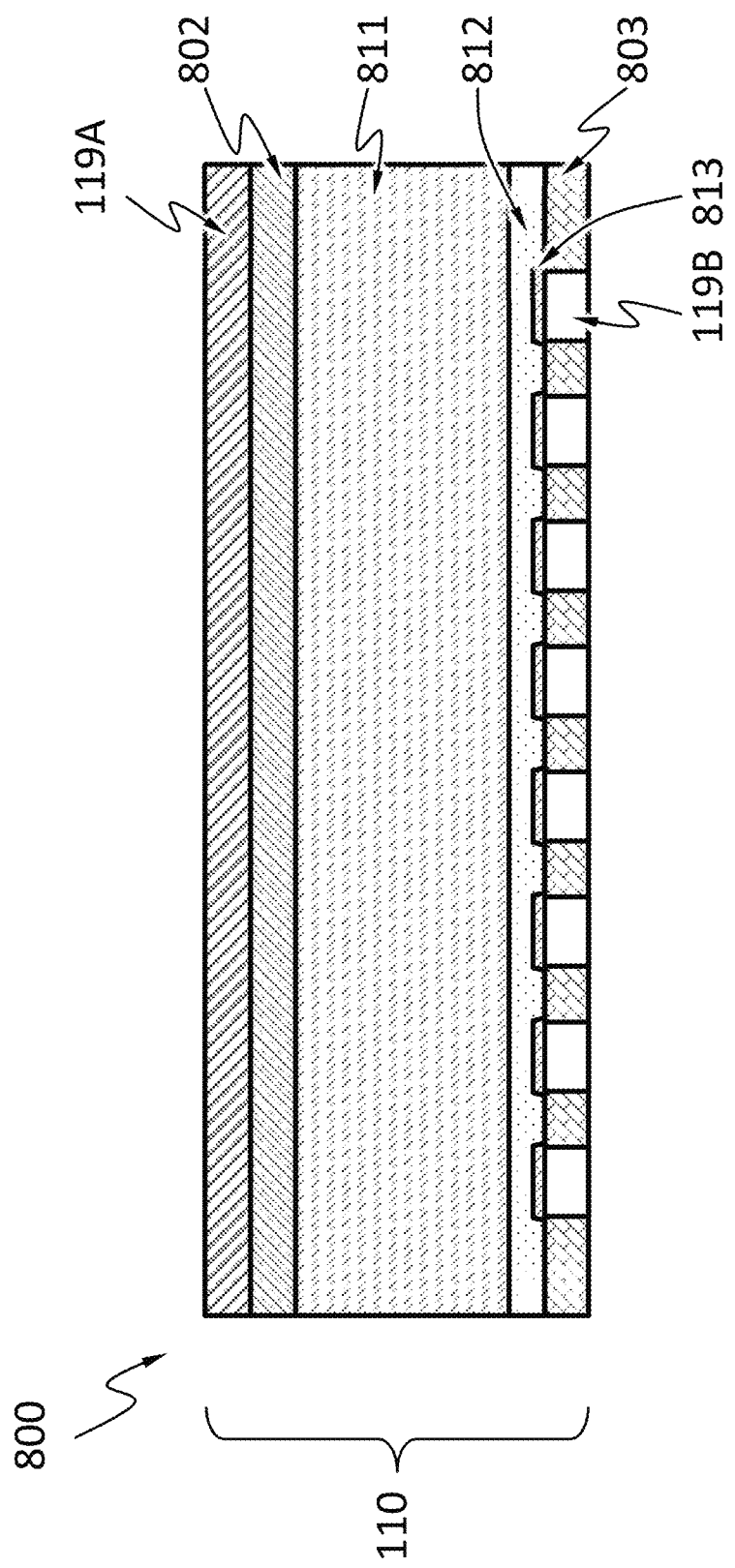
FIG. 8B shows a variant of the image sensor of FIG. 8A.
Figure 8C:
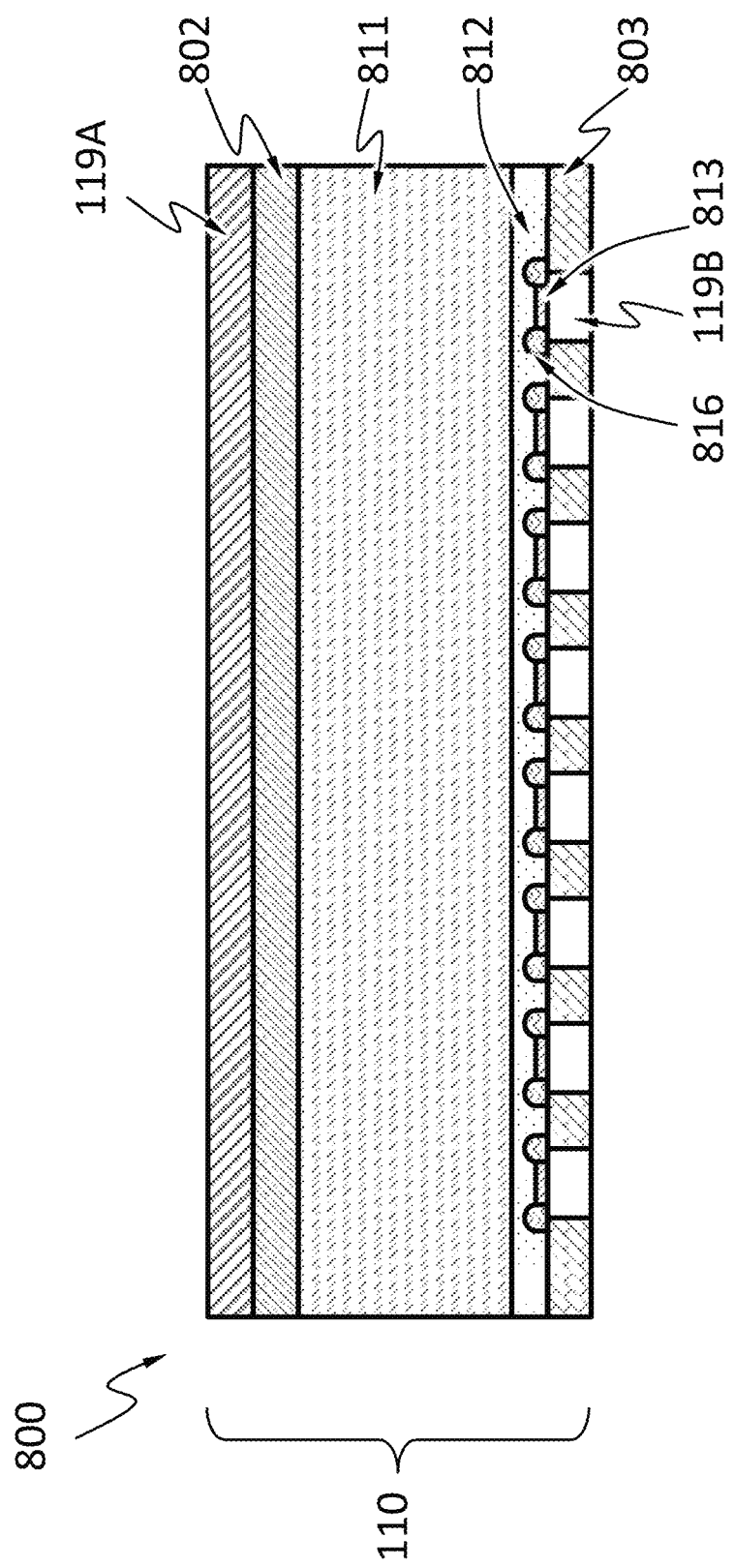
FIG. 8C shows a variant of the image sensor of FIG. 8A.
Figure 8D:
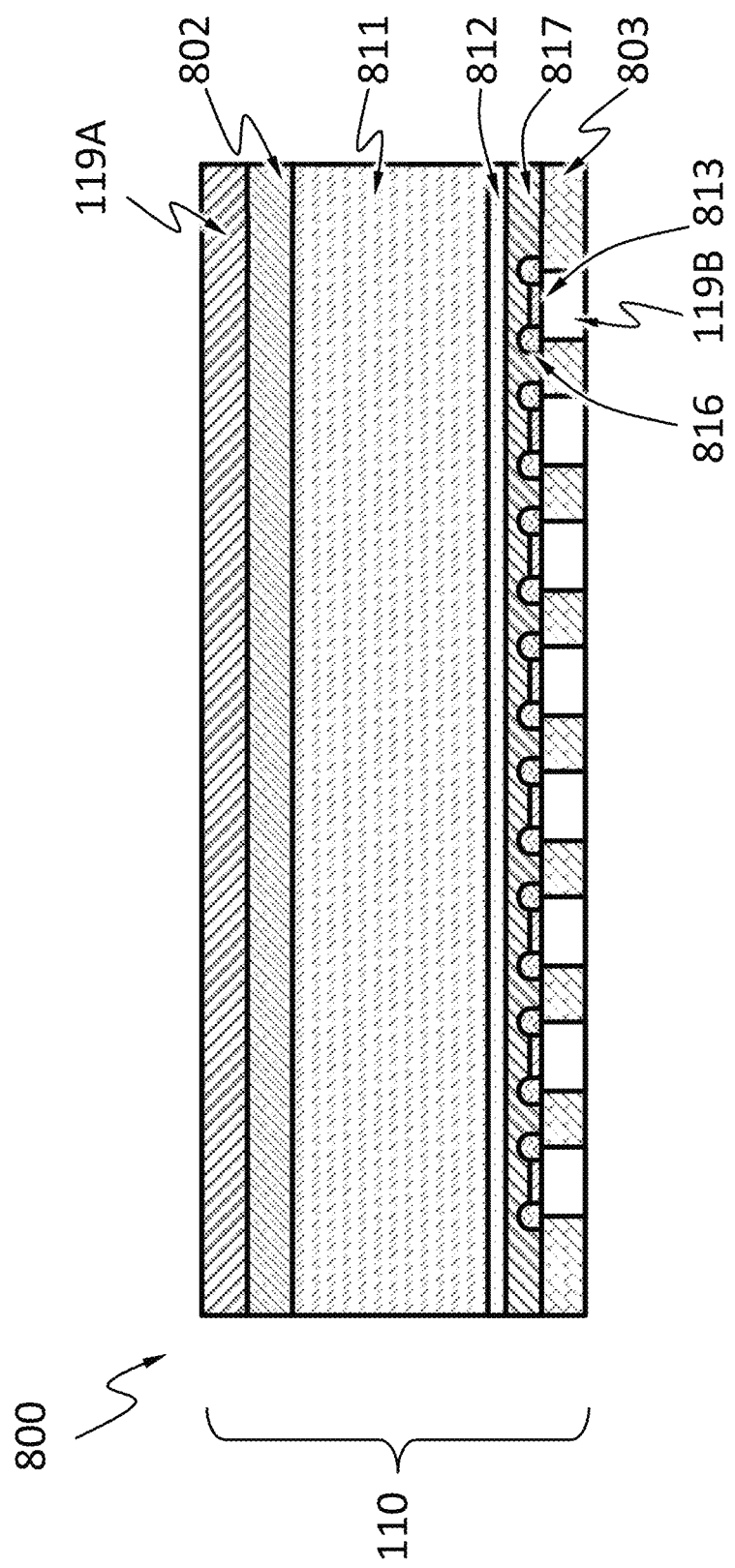
FIG. 8D shows a variant of the image sensor of FIG. 8A.

The junctions 815 of the APDs 850 should be discrete, i.e., the junction 815 of one of the APDs should not be joined with the junction 815 of another one of the APDs. Charge carriers amplified at one of the junctions 815 of the APDs 850 should not be shared with another of the junctions 815. The junction 815 of one of the APDs may be separated from the junction 815 of the neighboring APDs by the material of the absorption region wrapping around the junction, by the material of the layer 812 or 813 wrapping around the junction, by an insulator material wrapping around the junction, or by a guard ring of a doped semiconductor. As shown in FIG. 8A, the layer 812 of each of the APDs 850 may be discrete, i.e., not joined with the layer 812 of another one of the APDs; the layer 813 of each of the APDs 850 may be discrete, i.e., not joined with the layer 813 of another one of the APDs. FIG. 8B shows a variant of the photon detector 800, where the layers 812 of some or all of the APDs are joined together. FIG. 8C shows a variant of the photon detector 800, where the junction 815 is surrounded by a guard ring 816. The guard ring 816 may be an insulator material or a doped semiconductor. For example, when the layer 813 is heavily doped n-type semiconductor, the guard ring 816 may be n-type semiconductor of the same material as the layer 813 but not heavily doped. The guard ring 816 may be present in the photon detector 800 shown in FIG. 8A or FIG. 8B. FIG. 8D shows a variant of the photon detector 800, where the junction 815 has an intrinsic semiconductor layer 817 sandwiched between the layer 812 and 813. The intrinsic semiconductor layer 817 in each of the APDs 850 may be discrete, i.e., not joined with other intrinsic semiconductor layer 817 of another APD. The intrinsic semiconductor layers 817 of some or all of the APDs 850 may be joined together.

The photon detector 800 may be an embodiment of the photon detector 100. Although not shown, an embodiment of the photon detector 800 may also comprise the electronic system 121 as described here (e.g., electrically connected to the amplification region), and may be used in the system 600 as the photon detector 100.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   receiving photons using a photon detector including a capacitor;
   charging the capacitor with charge carriers generated by the photons;
   obtaining rates of change of a voltage across the capacitor; and
   determining a time at which the photons arrive at the photon detector, based on characteristics of the rates of change.

2. The method of claim 1, further comprising resetting the voltage across the capacitor.

3. The method of claim 1, wherein the characteristics of the rates of change comprise a time at which the rates of change have an extremum.

4. The method of claim 1, wherein the characteristics of the rates of change comprise a time at which the rates of change have a discontinuity.

5. The method of claim 1, further comprising emitting a light pulse.

6. The method of claim 5, further comprising allowing the capacitor to be charged upon emitting the light pulse.

7. The method of claim 5, wherein the photons received by the photon detector are of the light pulse scattered by an object.

8. The method of claim 7, further comprising determining a distance of the object to the photon detector based on the time at which the photons arrive at the photon detector.

9. A photon detector, comprising:
a photon absorption layer comprising an electric contact, the photon absorption layer configured to receive photons and to generate charge carriers from the photons;
a capacitor electrically connected to the electric contact and configured to be charged by the charge carriers; and
a controller;
wherein the controller is configured to obtain rates of change of a voltage across the capacitor and configured to determine a time at which the photons arrive at the photon detector, based on characteristics of the rates of change.

10. The photon detector of claim 9, wherein the controller is configured to reset the voltage across the capacitor.

11. The photon detector of claim 9, wherein the characteristics of the rates of change comprise a time at which the rates of change have an extremum.

12. The photon detector of claim 9, wherein the characteristics of the rates of change comprise a time at which the rates of change have a discontinuity.

13. The photon detector of claim 9, wherein the photon absorption layer comprises a diode.

14. The photon detector of claim 9, wherein the photon absorption layer comprises a resistor.

15. The photon detector of claim 9, wherein the photon absorption layer comprises an amplification region comprising a junction with an electric field in the junction; wherein the electric field is at a sufficient strength to cause an avalanche of charge carriers in the amplification region.

16. The photon detector of claim 9, wherein the photon absorption layer comprises silicon, germanium, GaAs, CdTe, CdZnTe, or a combination thereof.

17. The photon detector of claim 9, further comprising an array of pixels.

18. The photon detector of claim 9, wherein the photons are scattered by an object toward the photon detector, wherein the controller is configured to determine a distance of the object to the photon detector based on the time at which the photons arrive at the photon detector.

19. A LIDAR system comprising the photon detector of claim 9 and a light source configured to emit a light pulse.

* * * * *